United States Patent

Hamamoto et al.

(10) Patent No.: US 7,466,736 B2
(45) Date of Patent: Dec. 16, 2008

(54) SEMICONDUCTOR LASER DIODE, SEMICONDUCTOR OPTICAL AMPLIFIER, AND OPTICAL COMMUNICATION DEVICE

(75) Inventors: Kiichi Hamamoto, Tokyo (JP); Jan De Merlier, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 11/573,625

(22) PCT Filed: Jun. 29, 2005

(86) PCT No.: PCT/JP2005/011906

§ 371 (c)(1),
(2), (4) Date: May 7, 2007

(87) PCT Pub. No.: WO2006/016453

PCT Pub. Date: Feb. 16, 2006

(65) Prior Publication Data

US 2007/0258495 A1 Nov. 8, 2007

(30) Foreign Application Priority Data

Aug. 13, 2004 (JP) .............................. 2004-236185

(51) Int. Cl.
*H01S 5/00* (2006.01)

(52) U.S. Cl. ..................................... 372/43.01; 372/64

(58) Field of Classification Search .............. 372/43.01, 372/64
See application file for complete search history.

(56) References Cited

U.S. PATENT DOCUMENTS 6,205,163 B1 * 3/2001 Hamamoto .............. 372/43.01

FOREIGN PATENT DOCUMENTS

| JP | 11-68241 A | 3/1999 |
| JP | 11-68242 A | 3/1999 |
| JP | 2000-323781 A | 11/2000 |
| JP | 2002-319741 A | 10/2002 |

OTHER PUBLICATIONS

Lucas B. Soldano, et al., "Optical Multi-Mode Interference Devices Based on Self-Imaging: Principles and Applications", Journal of Lightware Technology, vol. 13, No. 4, pp. 615-627, Apr. 1995.

* cited by examiner

Primary Examiner—Dung T Nguyen
(74) Attorney, Agent, or Firm—Sughrue Mion, PLLC

(57) ABSTRACT

To provide a semiconductor laser diode and a semiconductor optical amplifier and an optical communication device incorporating the semiconductor laser diode or the semiconductor optical amplifier which enable low power consumption and high optical output. A semiconductor laser diode according to an embodiment of the present invention is a semiconductor laser diode 100 comprised of an active waveguide, the active waveguide including a first waveguide 11a that supplies a plurality of modes including a fundamental mode; and a second waveguide 12a that is wider than the first waveguide 11a and supplies a multimode, wherein the fundamental mode is provided as an oscillation light oscillated from the active waveguide.

16 Claims, 8 Drawing Sheets

SEMICONDUCTOR LASER DIODE, SEMICONDUCTOR OPTICAL AMPLIFIER, AND OPTICAL COMMUNICATION DEVICE

This application claims priority from PCT Application No. PCT/JP2005/011906 filed Jun. 29, 2005, and from Japanese Patent Application No. 2004-236185 filed Aug. 13, 2004, which applications are incorporated herein by reference.

TECHNICAL FIELD

The present invention relates to a waveguide type semiconductor laser diode, a semiconductor optical amplifier, and an optical communication device incorporating the same.

BACKGROUND ART

Nowadays, an optical electronics technology has been used in various fields such as an information input/output technology as represented by a compact disk and a photonic technology using an optical fiber. As a device supporting the optical electronics technology, various kinds of semiconductor laser diodes or semiconductor optical amplifiers have been developed.

Regarding the semiconductor laser diode, various structures have been developed. A waveguide type semiconductor laser diode is an example of the structures. In general, a waveguide configuration of the waveguide type semiconductor laser diode is designed to meet a fundamental mode condition in the case where information signals are transmitted in the form of light energy or the laser is used as an excitation light source of the optical fiber amplifier. The reason the fundamental mode condition is set is to overcome the following problems. That is, in general, under a multimode condition, there arise a problem that multimode dispersion exerts influence and a problem that signal light cannot be efficiently connected when the signal light is connected to another optical waveguide such as an optical fiber or a lens.

Up to now, in the waveguide type semiconductor laser diodes, a waveguide that allows transmission of only fundamental mode has been used to obtain a fundamental mode light. However, the waveguide that allows transmission of only fundamental mode has a problem that an amount of current supplied to the semiconductor laser diode is limited because of its small waveguide width (about 2 to 4 µm). This problem imposes technical limitations to gain a high optical output.

To that end, the applicants of the present invention proposed a semiconductor laser diode that can output a fundamental mode light and attain high optical output (Patent Documents 1 and 2). The semiconductor laser diode of Patent Documents 1 and 2 is configured such that fundamental mode waveguides are connected on both sides of a 1-input/N-output (N is a positive integer) type multimode interference waveguide (hereinafter abbreviated as "1×N-MMI (Multi mode Interference") semiconductor laser diode (see Non-Patent Document 1). As compared with the conventional waveguide that allows transmission of only fundamental mode, a waveguide width can be increased to enable high optical output.

[Patent Document 1]

Japanese Unexamined Patent Publication No. 11-68241

[Patent Document 2]

Japanese Unexamined Patent Publication No. 11-68242

[Non-Patent Document 1]

Lucas B. Soldano, Journal of Lightware Technology, Vol. 13, No. 4, pp. 615-627, 1995

DISCLOSURE OF THE INVENTION

Problems to be Solved by the Invention

By the way, the optical communication technology that enables high-speed large-volume communications has been applied to not only a backbone network connecting between megalopolises but also a so-called metropolitan network connecting between city regions, and an access network connected with houses or buildings. Along with the spread of the optical communication technology to metropolitan network or the access network, demands for devices supporting the optical communication technology, such as a semiconductor laser diode or a semiconductor optical amplifier, are expected to increase.

Thus, there is a growing need for low power consumption of the semiconductor laser diode as a device supporting the optical communication technology. Meanwhile, there is another need for higher optical output characteristics in the semiconductor laser diode in order to make up for an increase of the number of subscribers.

Incidentally, the above description is focused on the semiconductor laser diode, but the same problems would also occur in a semiconductor optical amplifier.

The present invention has been accomplished in view of the above circumstances, and an object of the present invention is to provide a semiconductor laser diode, a semiconductor optical amplifier, and an optical communication device incorporating the semiconductor laser diode or the semiconductor optical amplifier which realizes low power consumption as well as high optical output.

Means for Solving the Problems

In order to achieve the above-described object, a semiconductor laser diode according to a first aspect of the present invention is a semiconductor laser diode comprised of an active waveguide, the active waveguide comprising: a first waveguide that supplies a plurality of modes including a fundamental mode; and a second waveguide that is wider than the first waveguide and supplies a multimode, wherein fundamental mode is provided as an oscillation light oscillated from the active waveguide.

According to the first aspect of the present invention, a semiconductor laser diode that realizes low power consumption and high optical output can be provided. This is because the semiconductor laser diode according to the first aspect of the present invention includes a first waveguide that supplies a plurality of modes including a fundamental mode; and a second waveguide that is wider than the first waveguide and supplies a multimode, so a waveguide width can be set larger than that of an active waveguide that allows transmission of only fundamental mode or an active waveguide that combines a fundamental mode waveguide and a multimode waveguide as disclosed in Patent Document 1. As a result, an element resistance can be further reduced, and power consumption can be further saved.

Further, as compared with the active waveguide that combines a fundamental mode waveguide and a multimode waveguide as disclosed in Patent Document 1, the active waveguide that combines the first waveguide and the second waveguide of the present invention can reduce a waveguide width ratio between different waveguides. As a result, an excessive loss at the boundary between the first waveguide and the second waveguide can be suppressed. As a result, the active waveguide according to the first aspect of the present invention realizes higher optical output than that of the active waveguide that combines the fundamental mode waveguide and the multimode waveguide as disclosed in Patent Document 1.

In a semiconductor laser diode according to a second aspect of the present invention, a waveguide that supplies a fundamental mode and a first-order mode is used as an above-mentioned first waveguide, and a waveguide that does not allow the first-order mode as a standing wave is used as the above-mentioned second waveguide.

The semiconductor laser diode according to the second aspect of the present invention does not allow the first-order mode as a standing wave in the second waveguide, so first-order mode cannot exist as a standing wave in the active waveguide. As a result, the first-order mode cannot contribute to laser oscillation. Thus, only fundamental mode is output as laser light. The semiconductor laser diode according to the second aspect of the present invention can set larger waveguide width than the case of using a waveguide that supplies only a fundamental mode as a first waveguide. As a result, an element resistance can be reduced, and power saving is realized. Further, an excessive loss at the boundary between the first waveguide and the second waveguide can be suppressed, so high optical output is attained.

In a semiconductor laser diode according to a third aspect of the present invention, the second waveguide is a 1-input/N-output type 1×N (N is a positive integer) multimode interference waveguide.

According to a semiconductor laser diode of a fourth aspect of the present invention is a semiconductor laser diode according to any one of the first to third aspects, further comprising: a taper structure that is provided between the first waveguide and the second waveguide and has a waveguide width that is increased toward the second waveguide, and a waveguide that allows at least the fundamental mode is connected.

The semiconductor laser diode according to the fourth aspect of the present invention, a taper waveguide that allows only fundamental mode is provided between the first waveguide and the second waveguide, thereby an excessive loss at the boundary between different waveguides is more effectively suppressed. As a result, optical output can be more effectively increased.

A semiconductor optical amplifier according to a fifth aspect of the present invention is a semiconductor optical amplifier comprised of an active waveguide, the active waveguide comprising: a first waveguide that supplies a plurality of modes including a fundamental mode; and a second waveguide that is wider than the first waveguide and supplies a multimode, wherein fundamental mode is provided as an oscillation light oscillated from the active waveguide.

According to the fifth aspect of the present invention, a semiconductor optical amplifier that realizes low power consumption and high optical output can be provided. This is because the semiconductor optical amplifier according to the fifth aspect of the present invention includes a first waveguide that supplies a plurality of modes including a fundamental mode; and a second waveguide that is wider than the first waveguide and supplies a multimode, so a waveguide width can be set larger than that of an active waveguide that allows transmission of only fundamental mode or an active waveguide that combines a fundamental mode waveguide and a multimode waveguide as disclosed in Patent Document 1. As a result, an element resistance can be further reduced, and power consumption can be further saved.

Further, as compared with the active waveguide that combines a fundamental mode waveguide and a multimode waveguide as disclosed in Patent Document 1, the active waveguide that combines the first waveguide and the second waveguide of the present invention can reduce a waveguide width ratio between different waveguides. As a result, an excessive loss at the boundary between the first waveguide and the second waveguide can be suppressed. As a result, the active waveguide according to the first aspect of the present invention realizes higher optical output than that of the active waveguide that combines the fundamental mode waveguide and the multimode waveguide as disclosed in Patent Document 1.

In a semiconductor optical amplifier according to a sixth aspect of the present invention, a waveguide that supplies a fundamental mode and a first-order mode is used as an above-mentioned first waveguide, and a waveguide that does not allow the first-order mode as a standing wave is used as the above-mentioned second waveguide.

The semiconductor optical amplifier according to the sixth aspect of the present invention does not allow the first-order mode as a standing wave in the second waveguide, so the first-order mode cannot exist as a standing wave in the active waveguide. As a result, the first-order mode is not included in an amplified light. Accordingly, amplified and output light is only a fundamental mode. The semiconductor laser diode according to the second aspect of the present invention can set larger waveguide width than the case of using a waveguide that supplies only a fundamental mode as a first waveguide. As a result, an element resistance can be reduced, and power saving is realized. Further, an excessive loss at the boundary between the first waveguide and the second waveguide can be suppressed, so high optical output is attained.

In a semiconductor optical amplifier according to a seventh aspect of the present invention, the second waveguide is a 1-input/N-output type 1×N (N is a positive integer) multimode interference waveguide.

According to a semiconductor optical amplifier of an eighth aspect of the present invention is a semiconductor optical amplifier according to any one of the firth to seventh aspects of the invention, further comprising: a taper structure that is provided between the second waveguide and the first waveguide and has a waveguide width that is increased toward the second waveguide, and a waveguide that allows at least the fundamental mode is connected.

The semiconductor optical amplifier according to the eighth aspect of the present invention, a taper waveguide is provided between the first waveguide and the second waveguide, thereby an excessive loss at the boundary between different waveguides is more effectively suppressed. As a result, optical output can be more effectively increased.

An optical communication device according to a ninth aspect of the present invention incorporates the semiconductor laser diode and/or the semiconductor optical amplifier according to any one of the first to eighth aspects of the invention.

ADVANTAGES OF THE INVENTION

The present invention attains a beneficial effect of providing a semiconductor laser diode, a semiconductor optical amplifier, optical communication device incorporating the semiconductor laser diode or semiconductor optical amplifier which enable low power consumption as well as high optical output.

DESCRIPTION OF REFERENCE NUMERALS

11$a$, 11$d$ first pseudo fundamental mode waveguide
12$a$, 12$b$, 12$d$ 1×1-MMI waveguide
12$c$ 1×2-MMI waveguide
13$d$ first taper waveguide
21$a$, 21$b$, 21$d$ second pseudo fundamental mode waveguide
23$d$ second taper waveguide
31$b$ third pseudo fundamental mode waveguide
32$b$ third 1×1-MMI waveguide
41$b$ fourth pseudo fundamental mode waveguide
70$a$ laminate
71$a$ substrate
72$a$ cladding layer
73$a$ active layer
74$a$ cladding layer
75$a$ mesa
76$a$ blocking layer
76$a$ current blocking layer
77$a$ current blocking layer
78$a$ cladding layer
79$a$ contact layer
81$a$ first SCH layer
82$a$ MQW (Multi Quantum Well) layer
83$a$ second SCH layer
86$a$ buried layer
87$a$ surface electrode
88$a$ back electrode
91$a$ anti-reflection film
92$a$ high-reflection film
100, 101, 102, 103 active MMI type semiconductor laser diode

BEST MODES FOR CARRYING OUT THE INVENTION

Hereinafter, an exemplary embodiment of the present invention will be described. Incidentally, it is needless to say that the present invention encompasses other embodiments within the scope of the present invention.

Embodiment

Figure 1:
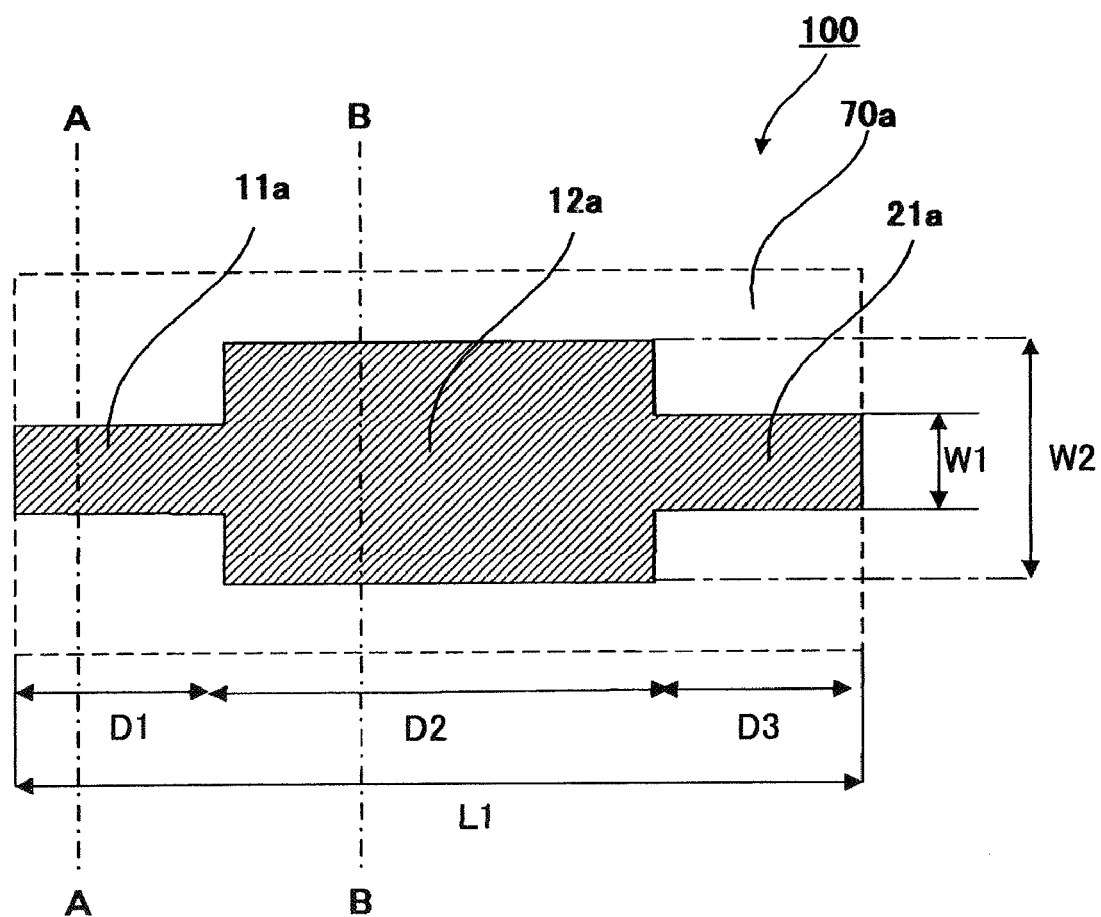
FIG. 1 is a plan view of a semiconductor laser diode according to an embodiment of the present invention.
Figure 2A:
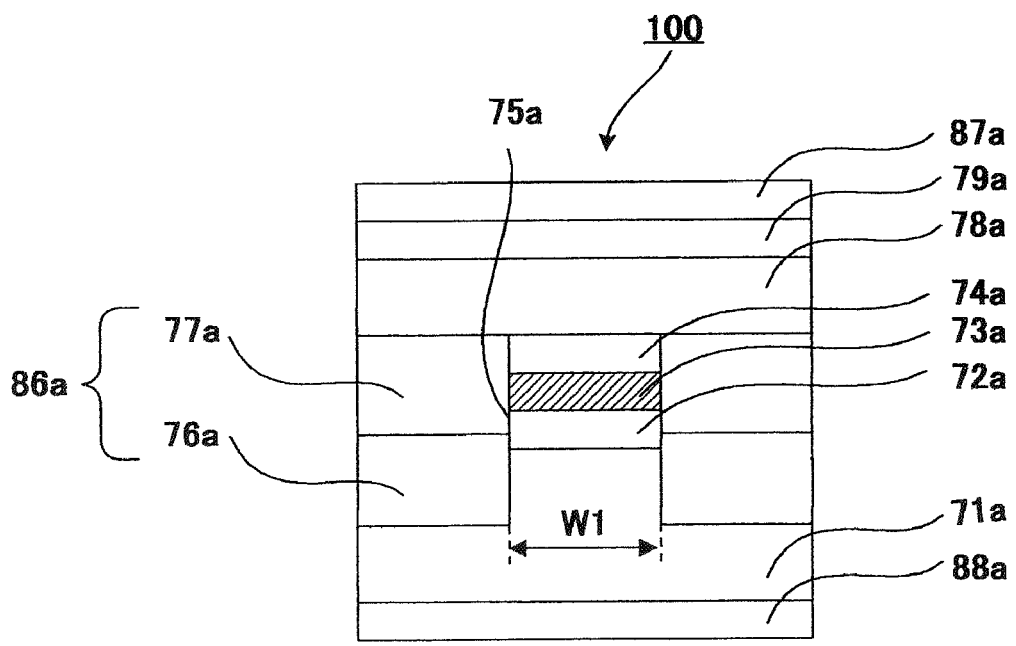
FIG. 2A is a sectional view of the semiconductor laser diode taken along the line A-A of FIG. 1.
Figure 2B:
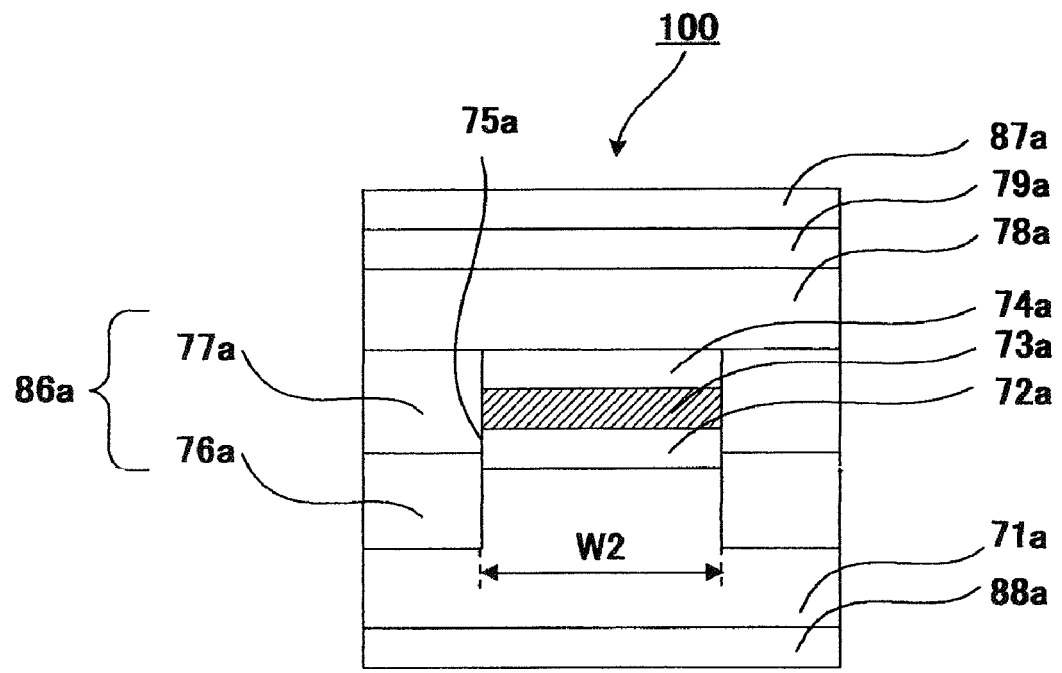
FIG. 2B is a sectional view of the semiconductor laser diode taken along the line B-B of FIG. 1.

FIG. 1 is a plan view of a semiconductor laser diode according to an embodiment of the present invention. FIG. 2A is a sectional view taken along the line A-A of FIG. 1, and FIG. 2B is a sectional view taken along the line B-B of FIG. 1. The semiconductor laser diode of this embodiment is an active MMI type semiconductor laser diode 100, that is, a buried heterostructure (BH) type semiconductor laser diode of 1.48 μm band.

The active MMI type semiconductor laser diode 100 of this embodiment has active waveguide structure including an active layer as described later. As shown in FIG. 1, the active waveguide includes a first waveguide region D1, a second waveguide region D2, and a third waveguide region D3. The first waveguide region D1 and the third waveguide region D3 have a first pseudo fundamental mode waveguide 11$a$ and a second pseudo fundamental mode waveguide 21$a$. The first pseudo fundamental mode waveguide 11$a$ and the second pseudo fundamental mode waveguide 21$a$ are waveguides where a zero-order mode (fundamental mode) and a first-order mode are transmissible.

Meanwhile, the second waveguide region D2 has a 1-input/1-output multimode interference (hereinafter abbreviated as "1×1-MMI (Multi mode Interference)") waveguide 12$a$.

The entire length of the semiconductor laser diode 100 (L1 in FIG. 1) is about 600 μm. The length of each of the first pseudo fundamental mode waveguide 11$a$ and the second pseudo fundamental mode waveguide 21$a$ is about 90 μm, and the length of the 1×1-MMI waveguide 12$a$ is about 420 μm.

The 1×1-MMI waveguide 12$a$ differs from the first pseudo fundamental mode waveguide 11$a$ and the second pseudo fundamental mode waveguide 21$a$ in its waveguide width. While the waveguide width (W2) of the 1×1-MMI waveguide 12$a$ is set to 13 μm, the waveguide width (W1) of the pseudo fundamental mode waveguide 11$a$ and the second pseudo fundamental mode waveguide 21$a$ is set to 4 μm (see FIG. 1 and FIG. 2).

As shown in FIGS. 2A and 2B, the active MMI type semiconductor laser diode 100 of this embodiment includes an n-InP substrate 71$a$. Further, an n-InP cladding layer 72$a$, an active layer 73$a$, and a p-InP first cladding layer 74$a$ are formed in a mesa form on the n-InP substrate 71$a$. Further, a p-InP current blocking layer 76$a$ and an n-InP current blocking layer 77$a$ are layered in this order in contact with side walls of a mesa 75$a$ on a surface having the active layer 73$a$ or the like (hereinafter referred to as "main surface") of the n-InP substrate 71$a$ where the active layer 73$a$ or the like is not still created. Further, a p-InP second cladding layer 78$a$ and a p-InGaAs contact layer 79$a$ are layered in this order (hereinafter these layers are collectively referred to as "laminate 70$a$") on the p-InP first cladding layer 74$a$ and the n-InP current blocking layer 77$a$.

Figure 3:
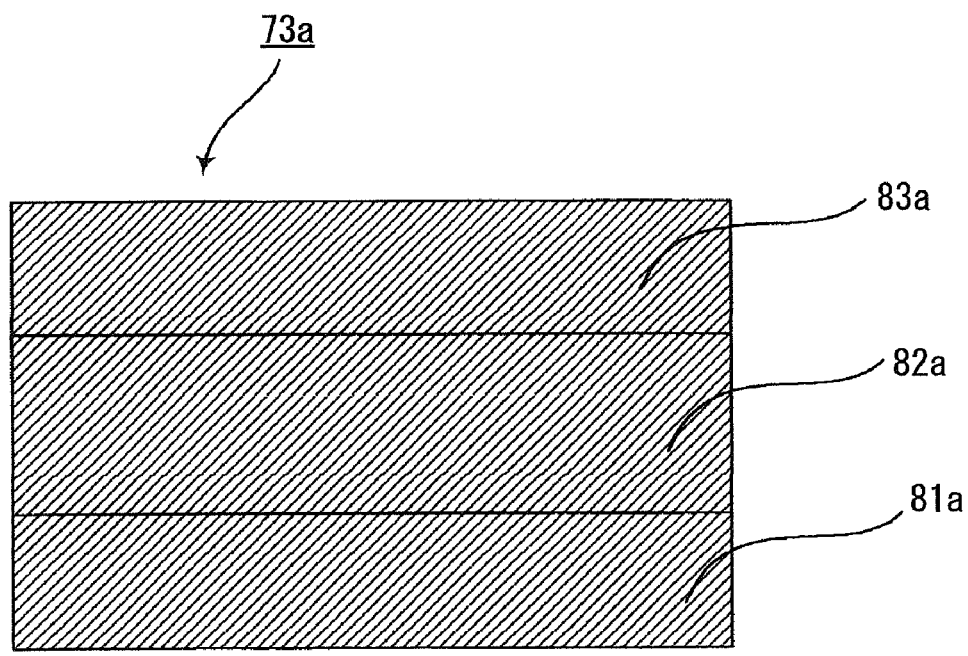
FIG. 3 is a sectional view of an active layer of the semiconductor laser diode of the embodiment.

As shown in FIG. 3, the active layer 73$a$ is structured such that an InGaAsP/InGaAsP-MQW (Multi Quantum Well) layer 82$a$, obtained by layering quantum well, is layered on an InGaAsP-first SCH (Separate Confinement Heterostructure) layer 81a, and then InGaAsP-second SCH layer 83a is formed thereon.

A surface electrode 87a is formed on the upper surface of the laminate 70a. Further, a back electrode 88a is formed on the other surface of the n-InP substrate 71a, which is opposite to the main surface (hereinafter simply referred to as "rear surface").

An anti-reflection film is formed on a front end face of the laminate 70a, and a high-reflection film is formed on a rear end face of the laminate 70a. Thereby reflecting mirror of front and rear of a laser oscillator is configured.

Hereinafter, a manufacturing method of the active MMI type semiconductor laser diode 100 of this embodiment will be described with reference to FIGS. 4A-4E. Incidentally, the following manufacturing process is given by way of example, and needless to say, other manufacturing methods can be used within the scope of the present invention.

Figure 4A:
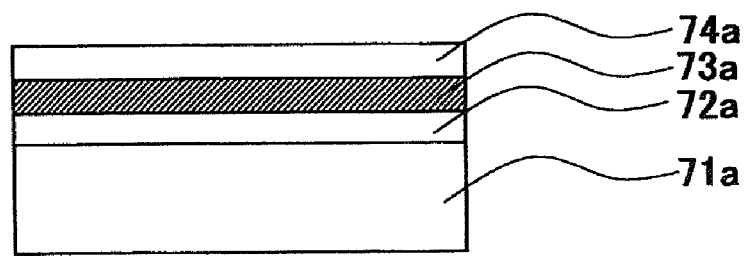
FIG. 4A is a sectional view of a manufacturing process for the semiconductor laser diode of the embodiment.

As shown in FIG. 4A, firstly, the n-InP cladding layer 72a, the active layer 73a, and the p-InP first cladding layer 74a are laminated on the n-InP substrate 71a through metal organic vapor phase epitaxy (MO-VPE) in this order.

Figure 4B:
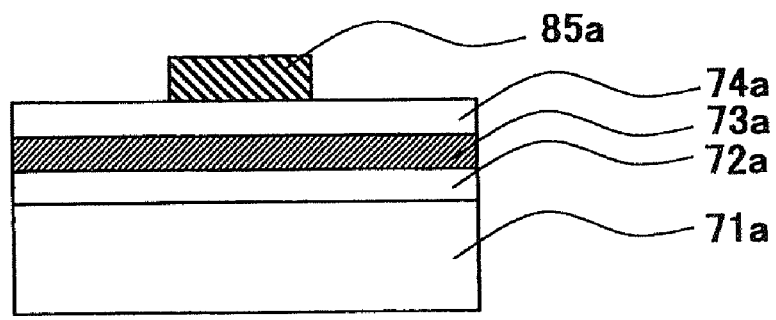
FIG. 4B is a sectional view of a manufacturing process for the semiconductor laser diode of the embodiment.

Next, as shown in FIG. 4B, an $SiO_2$ film 85a is next deposited on the front surface by using chemical vapor deposition (CVD), and a mesa-formation mask is formed on the p-InP first cladding layer 74a by using general photolithography and reactive ion etching (RIE).

Figure 4C:
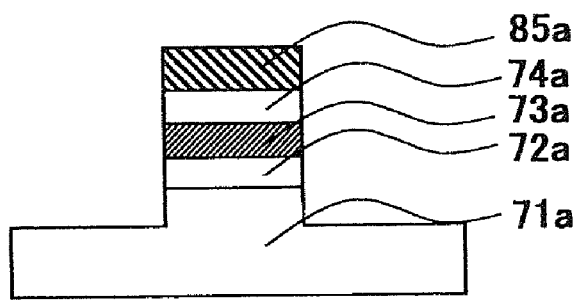
FIG. 4C is a sectional view of a manufacturing process for the semiconductor laser diode of the embodiment.

Next, as shown in FIG. 4C, the p-InP first cladding layer 74a, the active layer 73a, and the n-InP cladding layer 72a which are not covered with the mesa-formation mask are removed by using inductively coupled plasma (ICP), and form the mesa 75a as shown in FIG. 4C. After the formation of the mesa 75a, the p-InP blocking layer 76a and the n-InP current blocking layer 77a are formed around the mesa 75a by using MO-VPE, and the mesa-formation mask left above the mesa is removed with a buffered hydrofluoric acid. Thus, a ridge mesa can be buried. A buried layer 86a composed of the p-InP blocking layer 76a and the n-InP current blocking layer 77a works to confine current. Further, the buried layer 86a has a refractive index smaller than that of an active layer, thus the buried layer 86a works to confine light in a horizontal direction.

Figure 4D:
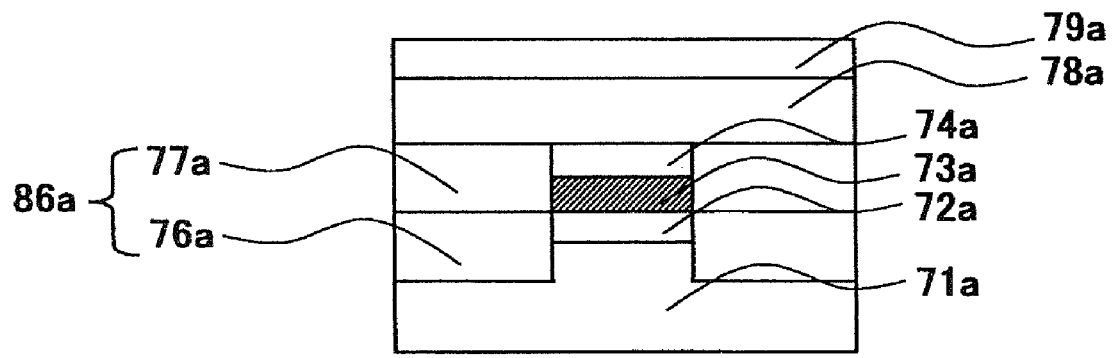
FIG. 4D is a sectional view of a manufacturing process for the semiconductor laser diode of the embodiment.
Figure 4E:
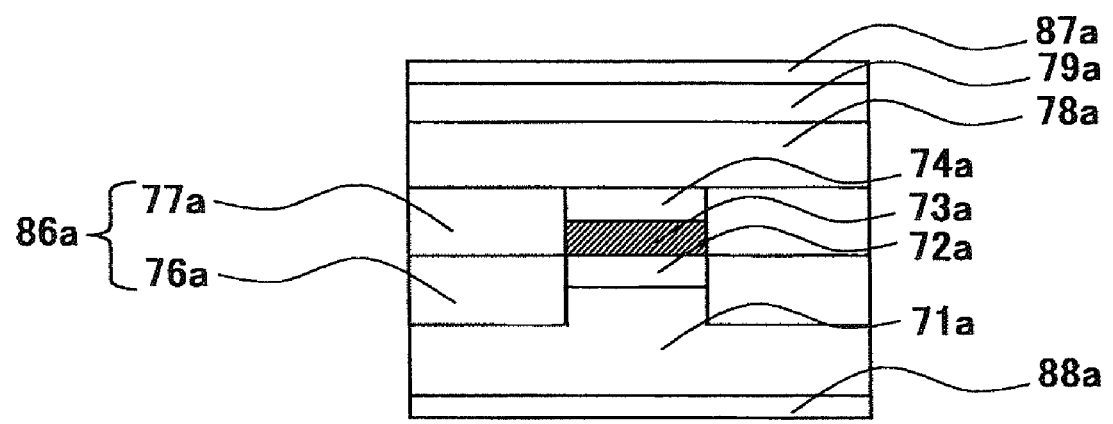
FIG. 4E is a sectional view of a manufacturing process for the semiconductor laser diode of the embodiment.

After that, as shown in FIG. 4D, the p-InP cladding layer 78a and the p-InGaAs contact layer 79a are formed in this order on the p-InP first cladding layer 74a and the n-InP current blocking layer 77a. Then, as shown in FIG. 4E, the surface electrode 87a is formed on the upper surface through electron beam deposition. The rear surface of the obtained n-InP substrate 71a is polished, and then the back electrode 88a is formed.

In accordance with the above manufacturing method, form plural laser elements on the substrate. And then gain each laser element by cleaving along the boundary between the laser elements. Form an anti-reflection film 91a on one end face formed through the cleaving, and form a high-reflection film 92a on the other end face thereof. The active MMI type semiconductor laser diode 100 of this embodiment is manufactured in accordance with the above process.

Incidentally, this embodiment describes the semiconductor laser diode. However, the present invention is usable as a semiconductor optical amplifier, instead of an anti-reflection film and high-reflection film formed on end faces of the laser element of this embodiment but replacing an anti-reflection film on the both end faces immediately after the cleaving.

Hereinafter, the principle that the semiconductor laser diode of this embodiment realizes low power consumption and high optical output is described.

In an active MMI type semiconductor laser diode of this embodiment, a current is supplied to the active layer 73a positioned at the center of the mesa structure limited by the current blocking layer by applying a predetermined bias voltage between the surface electrode 87a and the back electrode 88a. If the supplied current is below a threshold value, spontaneous emission and absorption occur. On the other hand, if the supplied current is equal to or higher than a threshold value, that is, if induced emission exceeds absorption, it is possible to oscillate a laser.

Under the laser oscillatable state, light amplified through induced emission propagates as multimode in a second waveguide region D2 based on the MMI theory (see Non-Patent Document 1 above). On the other hand, the light propagates as zero-order mode and first-order mode in a first waveguide region D1 and a second waveguide region D3 on both sides of the region D2. In this embodiment, the length of the MMI waveguide region is derived from the following expressions.

$$L_{MMI} \approx n \times (3L_X)/(4N) \quad \text{[Expression 1]}$$

where $L_n$ represents a beat length and satisfies Expression 2 below.

$$L\pi \approx (4n_r W_e^2)/(3\lambda_0) \quad \text{[Expression 2]}$$

Further, $L_{MMI}$ is a second waveguide region length, n is a positive integer except for an integral multiple of 4, $n_r$ is an effective refractive index of a waveguide region, $W_e$ is an effective waveguide width of the MMI region, $\lambda_0$ is a wavelength, and N is the number of N-side ports in the 1×N-MMI waveguide.

By designing the region length of the 1×1-MMI waveguide 12a to satisfy Expressions 1 and 2 above, it is impossible to excite odd-mode in the 1×1-MMI waveguide 12a. Hence, the odd-mode cannot exist as a standing wave in the active waveguide (in a cavity of the semiconductor laser diode). Therefore, even if first-order mode is generated in the first pseudo fundamental mode waveguide 11a and the second pseudo fundamental mode waveguide 21a, the first-order mode cannot exist as a standing wave. Further, since the first pseudo fundamental mode waveguide 11a and the second pseudo fundamental mode waveguide 21a only allow zero-order mode (fundamental mode) and first-order mode, after all, a laser oscillation beam becomes fundamental mode.

By utilizing this principle, a pseudo fundamental mode waveguide can be placed in the cavity. That is, a zero-order mode and first-order mode transmissible waveguide having the width that is substantially double of the general fundamental mode waveguide width is connectable to the 1×1-MMI waveguide. In this embodiment, a ratio of the MMI waveguide width to the pseudo fundamental mode waveguide is 3.25. If the fundamental mode waveguide is used in place of the pseudo fundamental mode waveguide, the ratio is about 6.5. That is, this embodiment enables to lower the ratio 50% compared with the combination of the fundamental mode waveguide and the 1×1-MMI waveguide. As a result, it is possible to suppress an excessive loss at a boundary between the MMI waveguide and the pseudo fundamental mode waveguide, and high optical output is achieved.

Further, the active MMI type semiconductor laser diode 100 of this embodiment improves a saturation injection current value, and high output of the semiconductor laser diode is achieved owing to high current injection. Further, the semiconductor laser diode contains a multimode waveguide region having high optical confinement property, so its threshold current density is considerably lowered.

Further, a pseudo fundamental mode waveguide is adopted as a first waveguide in place of the fundamental mode waveguide, it is possible to set a width of a waveguide larger. As a result, an element resistance can be further reduced, and power consumption can be further saved.

Further, the layer structure of the active MMI type semiconductor laser diode 100 of this embodiment is similar to that of a general semiconductor laser diode. Thus, the active MMI type semiconductor laser diode 100 of this embodiment can be manufactured in accordance with the same process as a general manufacturing process of a semiconductor laser diode. That is, the laser can be manufactured by applying only an existing manufacturing method, thus, a laser excelling in reproducibility and yield can be provided. Accordingly, cost reduction is achieved.

Incidentally, as a crystal growth method, a molecular beam growth can be used instead of the above MO-VPE method. As a mesa formation step, reactive ion etching (RIE) may be used in place of the ICP method. Further, a structure of the semiconductor laser diode is the simple buried heterostructure (BH) but may be a ridge structure or a DC-PBH (Double Channel Planner Buried Heterostrucutre) excellent in current confining property.

Further, a laser wavelength is in a 1.48-μm band, but may be in other bands such as a visible band, a 0.98-μm band, and a near-infrared band.

MODIFIED EXAMPLE 1

Figure 5:
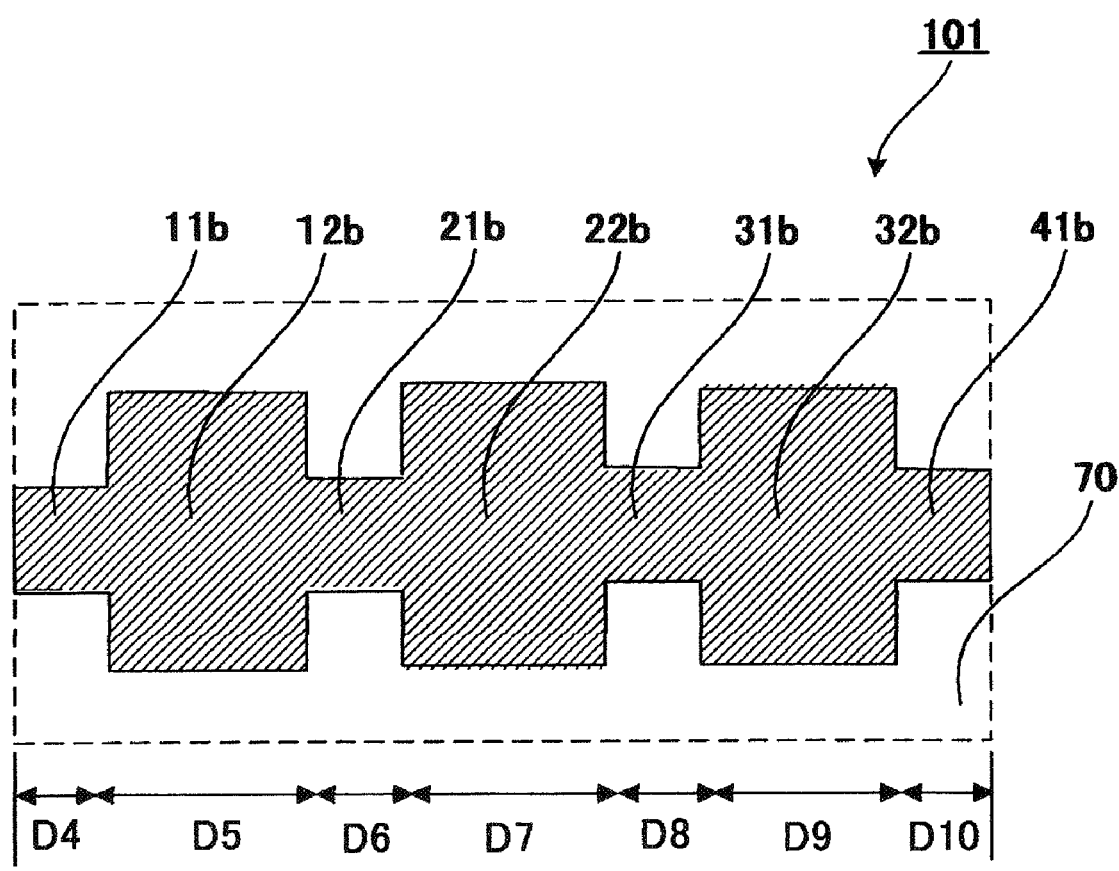
FIG. 5 is a plan view of a semiconductor laser diode according to Modified Example 1.

Next, a modified example of the active MMI type semiconductor laser diode 100 of the above embodiment is described. FIG. 5 is a plan view of an active MMI type semiconductor laser diode 101 of Modified Example 1. Incidentally, in the following description, the same components as those of the above embodiment are denoted by like reference numerals, and description thereof is omitted here.

The basic structure of the active MMI type semiconductor laser diode 101 of Modified Example 1 is the same as the above embodiment except that the active waveguide of the above embodiment is configured such that one 1×1-MMI waveguide is sandwiched between the two pseudo fundamental mode waveguides, while the active waveguide of Modified Example 1 is structured such that three 1×1-MMI waveguides are provided, and a pseudo fundamental mode waveguide is connected to an end portion of each 1×1-MMI waveguide.

To be specific, while the active waveguide of the above embodiment is composed of the first waveguide region D1, the second waveguide region D2, and the third waveguide region D3, the active waveguide of Modified Example 1 is composed of a first waveguide region D4, a second waveguide region D5, a third waveguide region D6, a fourth waveguide region D7, a fifth waveguide region D8, a sixth waveguide region D9, and a seventh waveguide region D10 as shown in FIG. 5. Further, while the pseudo fundamental mode waveguide of the above embodiment is provided on the first waveguide region D1 (first pseudo fundamental mode waveguide 11a) and the third waveguide region D3 (second pseudo fundamental mode waveguide 21a), the pseudo fundamental mode waveguide of Modified Example 1 is provided on the first waveguide region D4 (first pseudo fundamental mode waveguide 11b), the third waveguide region D6 (second pseudo fundamental mode waveguide 21b), the fifth waveguide D8 (third pseudo fundamental mode waveguide 31b), and the seventh waveguide D10 (fourth pseudo fundamental mode waveguide 41b). Further, while the 1×1-MMI waveguide of the above embodiment is provided on the second waveguide region D2 (1×1-MMI waveguide 12a), a 1×1- MMI waveguide of Modified Example 1 is provided on the second waveguide region D5 (first 1×1-MMI waveguide 12b), the fourth waveguide region D7 (second 1×1-MMI waveguide 22b), and the sixth waveguide region D9 (third 1×1-MMI waveguide 32b).

The first 1×1-MMI waveguide 12b, the second 1×1-MMI waveguide 22b, and the third 1×1-MMI waveguide 32b are designed to satisfy Expressions 1 and 2 above.

According to Modified Example 1, high optical output and low power consumption can be realized based on the same principle as that of the above embodiment. Further, the laser can be manufactured by applying only an existing manufacturing method. Thus, a laser excelling in reproducibility and yield can be provided. Accordingly, cost reduction is achieved.

Incidentally, Modified Example 1 describes an example where the three 1×1-MMI waveguides as the second waveguide are provided. However, needless to say, the number of waveguides is not particularly limited.

MODIFIED EXAMPLE 2

Figure 6:
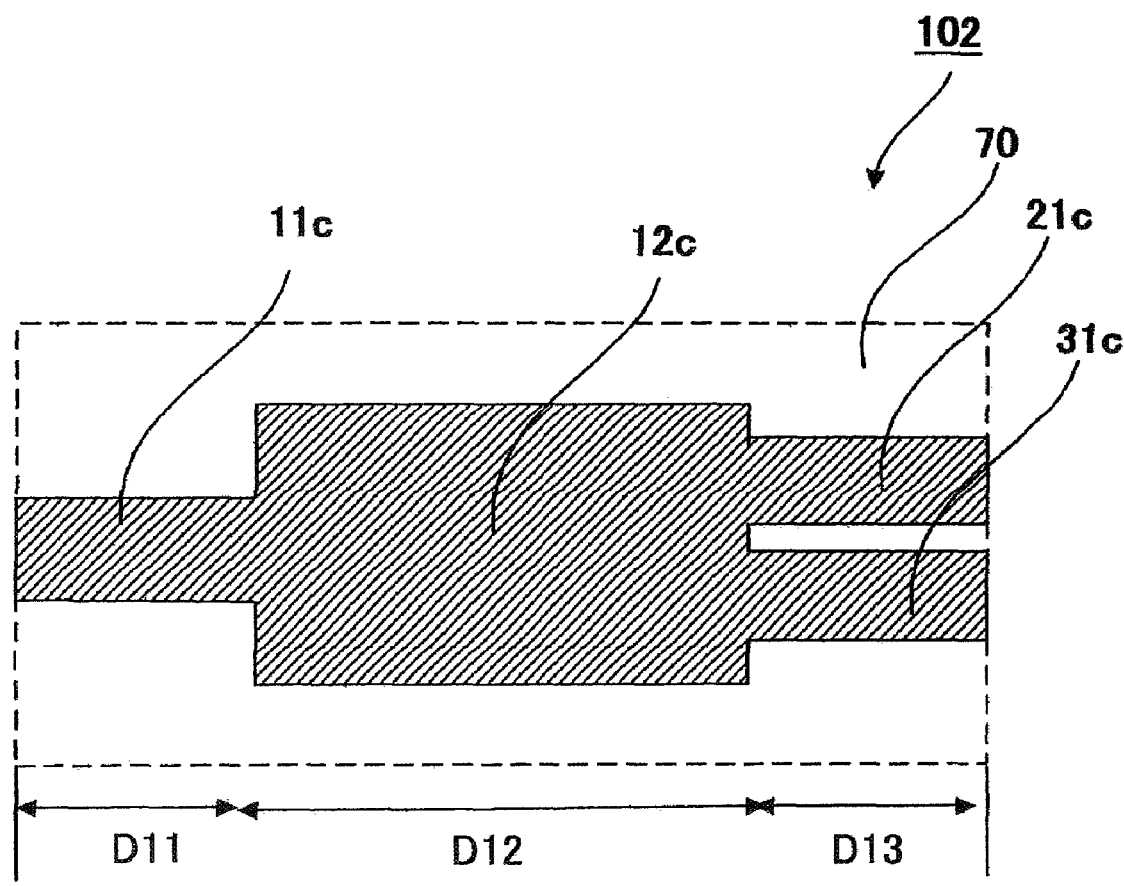
FIG. 6 is a plan view of a semiconductor laser diode according to Modified Example 2.

Next, a modified example different from the above embodiment and Modified Example 1 is described. FIG. 6 is a plan view of an active MMI type semiconductor laser diode 102 of Modified Example 1. The basic structure of active MMI type semiconductor laser diode 102 of Modified Example 2 is the same as that of the above embodiment except that the second waveguide of the above embodiment is the 1×1-MMI waveguide 12a, while the second waveguide of Modified Example 1 is a 1×2-MMI waveguide 12c as shown in FIG. 6. As shown in FIG. 6, the waveguide is composed of a first waveguide region D11, a second waveguide region D12, and a third waveguide region D13. The first waveguide region D1 and the third waveguide region D3 are composed of a first pseudo fundamental mode waveguide 11c, a second pseudo fundamental mode waveguide 21c, and a third pseudo fundamental mode waveguide 31c. Needless to say, the 1×2-MMI waveguide 12c is designed to satisfy Expressions 1 and 2 above.

According to Modified Example 2, high optical output and low power consumption can be realized based on the same principle as that of the above embodiment. Further, the laser can be manufactured by applying only an existing manufacturing method. Thus, a laser excelling in reproducibility and yield can be provided. Accordingly, cost reduction is achieved.

Incidentally, Modified Example 2 describes the 1×2-MMI waveguide as the second waveguide, but the present invention is not limited thereto and is applicable to a 1×N-MMI waveguide (N is a positive integer). Further, the structure having plural MMI regions is applicable similar to Modified Example 1.

MODIFIED EXAMPLE 3

Figure 7:
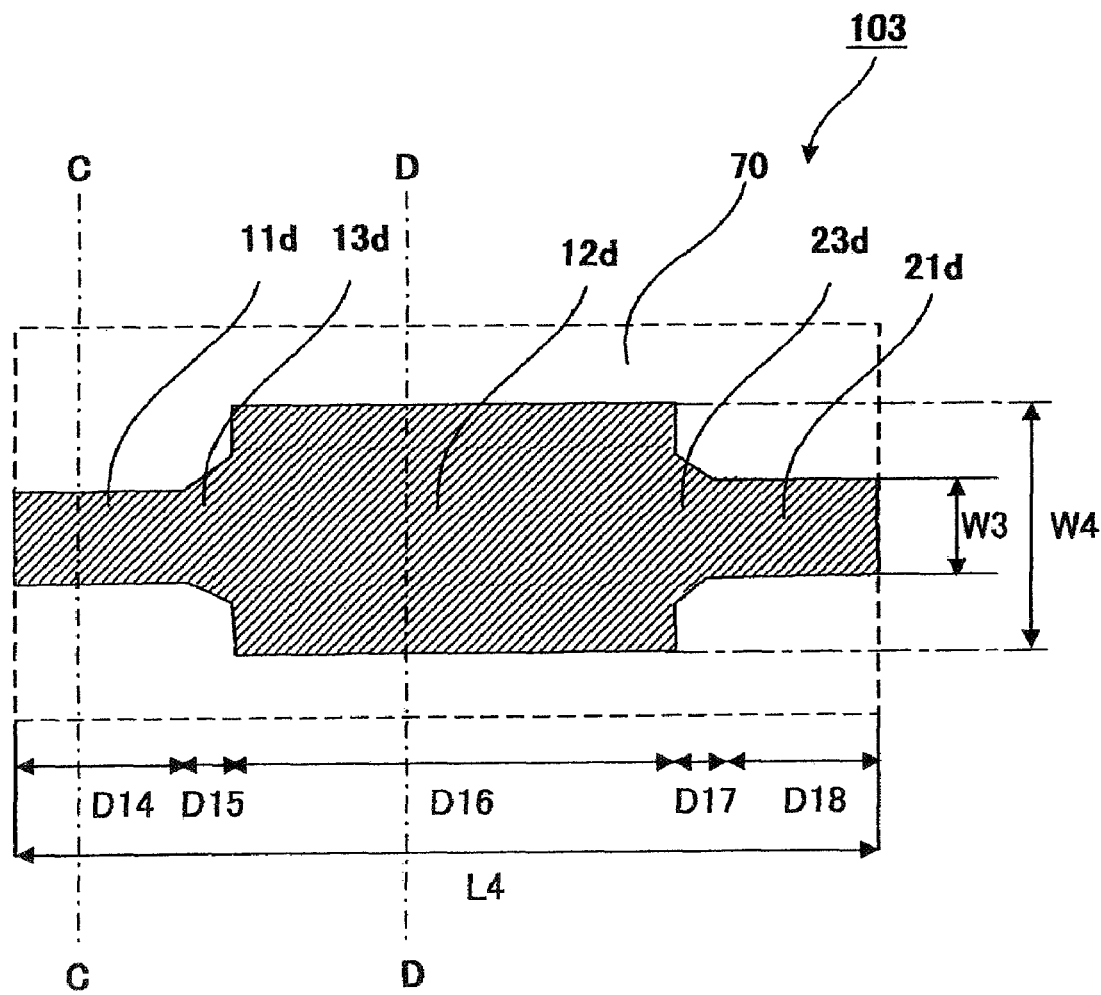
FIG. 7 is a plan view of a semiconductor laser diode according to Modified Example 3.
Figure 8A:
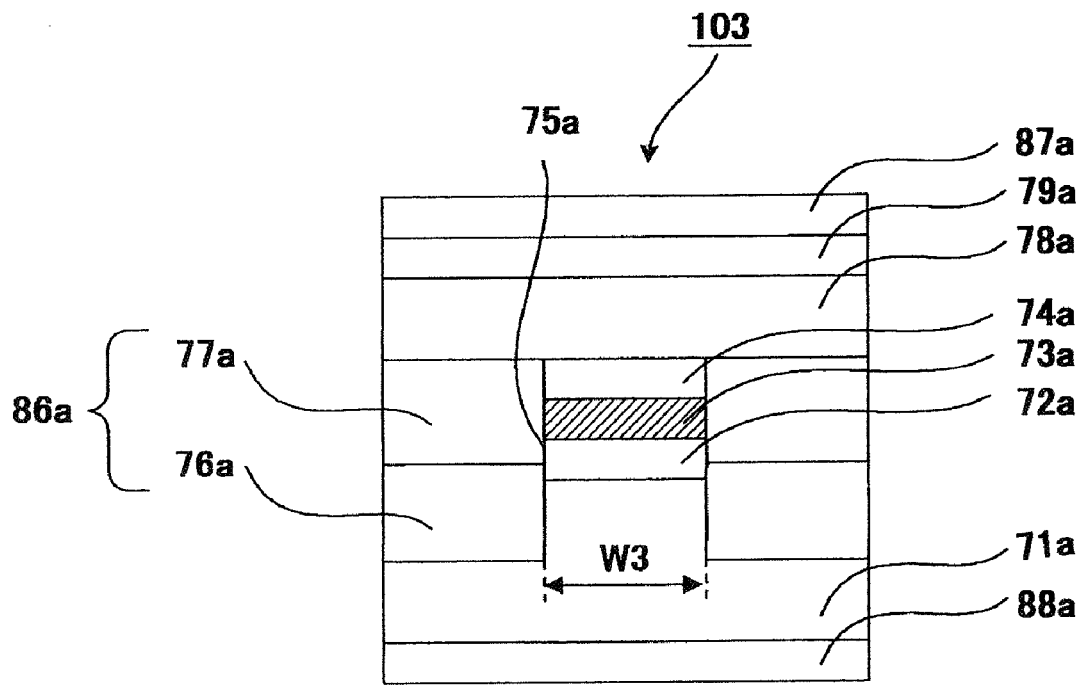
FIG. 8A is a sectional view taken along the line C-C of the semiconductor laser diode of FIG. 7.
Figure 8B:
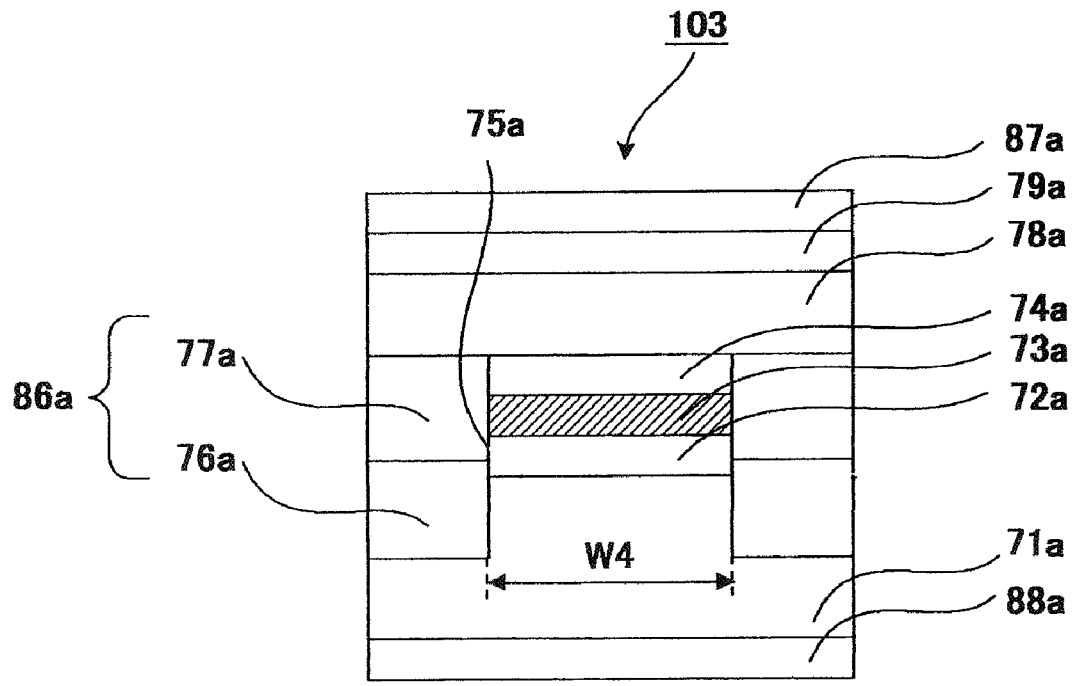
FIG. 8B is a sectional view taken along the line D-D of the semiconductor laser diode of FIG. 7.

Next, a modified example different from the above embodiment and Modified Examples 1 and 2 is described. FIG. 7 is a plan view of an active MMI type semiconductor laser diode 103 of Modified Example 3. FIG. 8A is a sectional view taken along the line C-C of FIG. 7, and FIG. 8B is a sectional view taken along the line D-D of FIG. 7.

The basic structure of the semiconductor laser diode 103 of Modified Example 3 is the same as that of the above embodiment except that the active waveguide of the above embodiment is configured such that the first pseudo fundamental mode waveguide 11a and the 1×1-MMI waveguide 12a are directly connected at an end portion, while in Modified Example 3, as shown in FIG. 7 and FIG. 8, a pseudo fundamental mode waveguide is connected with a 1×1-MMI waveguide via a taper waveguide.

To be specific, while the active waveguide of the above embodiment is composed of the first waveguide region D1, the second waveguide region D2, and the third waveguide region D3, the active waveguide of Modified Example 3 is composed of a first waveguide region D14, a second waveguide region D15, a third waveguide region D16, a fourth waveguide region D17, and a fifth waveguide region D18. Further, while the pseudo fundamental mode waveguide of the above embodiment is provided on the first waveguide region D1 (pseudo fundamental mode waveguide 11a) and the third waveguide region D3 (second pseudo fundamental mode waveguide 21a), the pseudo fundamental mode waveguide of Modified Example 3 is provided on a first waveguide region D14 (first pseudo fundamental mode waveguide 11d), and a fifth waveguide region D18 (second pseudo fundamental mode waveguide 21d). Further, while the 1×1-MMI waveguide of the above embodiment is provided on the second waveguide region D2 (1×1-MMI waveguide 12a), the 1×1-MMI waveguide of Modified Example 3 is provided on a third waveguide region D16 (1×1-MMI waveguide 12d). Further, in the above embodiment, the pseudo fundamental mode waveguide and the 1×1-MMI waveguide are directly connected together, while in Modified Example 3, a first taper waveguide 13d is provided between the first pseudo fundamental mode waveguide 11d and the 1×1-MMI waveguide 12d, and a second taper waveguide 23d is provided between the second pseudo fundamental mode waveguide 21d and the 1×1-MMI waveguide 12d.

As shown in FIG. 7, the first taper waveguide 13d and the second taper waveguide 23d are designed to have a width equal to a pseudo fundamental mode waveguide width at the junction with a pseudo fundamental mode waveguide and a waveguide width is set to increase toward the junction with the 1×1-MMI waveguide 12d.

The entire length of the active MMI type semiconductor laser diode 103 (L4 of FIG. 7) is about 600 μm. The length of each of the first pseudo fundamental mode waveguide 11d and the second pseudo fundamental mode waveguide 21d are about 60 μm, and the length of the 1×1-MMI waveguide 12d is about 420 μm. Further, the length of each of the first taper waveguide 13d and the second taper waveguide 23d is about 30 μm.

A difference among the 1×1-MMI waveguide 12d, the first pseudo fundamental mode waveguide 11d and the second pseudo fundamental mode waveguide 21d, and the first taper waveguide 13d and the second taper waveguide 23d is a waveguide width similar to the above embodiment. A waveguide width (W4) of the 1×1-MMI waveguide 12d and a waveguide width (W3) of the first pseudo fundamental mode waveguide 11d and the second pseudo fundamental mode waveguide 21d are set same as the above embodiment.

The layer structure of the active MMI type semiconductor laser diode 103 of Modified Example 3 is the same as that of the above embodiment as shown in FIG. 7 and FIG. 8. Further, the same manufacturing method as that of the above embodiment can be used.

The principle that the semiconductor laser diode of Modified Example 3 can realize higher optical output and lower power consumption than a conventional laser is described below.

In the active MMI type semiconductor laser diode 103 of Modified Example 3, it is possible to supply a current to the active layer 73a at the center of the mesa structure limited by the current blocking layer, by applying a predetermined bias voltage between a surface electrode 87a and a back electrode 88a as shown in FIGS. 8A and 8B. If the supplied current is below a threshold current amount, spontaneous emission and absorption occur. On the other hand, if the supplied current is equal to or more than a threshold current amount, that is, if induced emission exceeds absorption, it is possible to oscillate a laser.

Under the laser oscillatable state, light amplified due to the induced emission propagates as multimode in a third waveguide region D16 based on the MMI theory (see Non-Patent Document 1). On the other hand, the light propagates as zero-order mode and first-order mode in a first waveguide region D14 and a fifth waveguide region D18 which is on both sides of the region. In Modified Example 3, the length of a MMI waveguide region is designed following the Expressions 1 and 2 above.

The region length of the 1×1-MMI waveguide 12d is designed to satisfy Expressions 1 and 2, thereby prevent odd-mode from being excited in the 1×1-MMI waveguide 12d. Thus, the odd-mode cannot exist as a standing wave in the active waveguide (in a cavity of the semiconductor laser diode). Therefore, even if first-order mode is generated in the first pseudo fundamental mode waveguide 11d and the second pseudo fundamental mode waveguide 21d, the first-order mode cannot exist as a standing wave because the first order mode is the odd mode. Further, since the first pseudo fundamental mode waveguide 11d and the second pseudo fundamental mode waveguide 21d allow transmission of only zero-order mode (fundamental mode) and first-order mode, only a laser beam of zero-order mode (fundamental mode) is output in the end. By utilizing this principle, a pseudo fundamental mode waveguide and a taper waveguide can be arranged in a cavity.

Further, if a pseudo fundamental mode waveguide is used in place of the fundamental mode waveguide, a waveguide width can be set larger. As a result, an element resistance can be further reduced, and power consumption can be further saved. Further, since a taper region is formed, an excessive loss at the boundary between different waveguides can be ultimately suppressed. As a result, optical output can be more effectively increased.

Here, studies are made on a taper region length enough to ultimately suppress an excessive loss similar to Modified Example 3 under such condition that a 2 μm-wide fundamental mode waveguide is used as the first pseudo fundamental mode waveguide 11d and the second pseudo fundamental mode waveguide 21d. As a result of the studies, it is revealed that the taper region length needs to be equal to or more than 120 μm. In this case, there arises a problem that the length of regions other than the MMI region becomes larger. If a ratio of the region length of the 1×1-MMI waveguide 12d as the second waveguide to the entire active waveguide is reduced, the total resistance of the laser element increases rather than decreases, and as a result, power saving and high optical output accompanying resistance reduction as the intended purpose cannot be attained.

Meanwhile, according to Modified Example 3, a taper region can be set to about 30 μm to ultimately suppress an excessive loss. Accordingly, a ratio of the region length of the 1×1-MMI waveguide 12d to the active waveguide is little reduced as compared with the case of using the fundamental mode waveguide. Accordingly, it is possible to provide a laser that enables low power consumption as well as high optical output.

Further, the layer structure of the active MMI type semiconductor laser diode of Modified Example 3 is similar to that of a general semiconductor laser diode. Hence, the active MMI type semiconductor laser diode 103 of Modified Example 3 can be manufactured with the same manufacturing process as that of the general semiconductor laser diode. That is, the laser can be manufactured by applying only an existing manufacturing method. Thus, a laser excelling in reproducibility and yield can be provided. Accordingly, cost saving is realized. Incidentally, in Modified Example 3, the MMI region is set 1×1, but the present invention is not limited thereto and is applicable to 1×N-MMI (N is a positive integer). Further, the structure having plural MMI regions is applicable similar to Modified Example 1.

The invention claimed is:

1. A semiconductor laser diode comprising an active waveguide where a fundamental mode waveguide that supplies only a fundamental mode is not provided, the active waveguide comprising:
   a first waveguide that supplies a plurality of modes including a fundamental mode and a mode other than the fundamental mode; and
   a second waveguide that is wider than the first waveguide and supplies a multimode,
   wherein the fundamental mode is provided as an oscillation light oscillated from the active waveguide.

2. The semiconductor laser diode according to claim 1, wherein the first waveguide supplies the fundamental mode and a first-order mode, and
   the second waveguide does not allow the first-order mode as a standing wave.

3. The semiconductor laser diode according to claim 1, wherein the second waveguide is a 1-input/N-output type 1×N (N is a positive integer) multimode interference waveguide.

4. The semiconductor laser diode according to claim 1, wherein a taper structure having a waveguide width that is increased toward the second waveguide is provided between the second waveguide and the first waveguide.

5. The semiconductor laser diode according to claim 2, wherein the second wave guide is a 1-input/N-output type 1×N (N is a positive integer) multimode interference waveguide.

6. The semiconductor laser diode according to claim 2, wherein a taper structure having a waveguide width that is increased toward the second waveguide is provided between the second waveguide and the first waveguide.

7. The semiconductor laser diode according to claim 3, wherein a taper structure having a waveguide width that is increased toward the second waveguide is provided between the second waveguide and the first waveguide.

8. A semiconductor optical amplifier comprising an active waveguide where a fundamental mode waveguide that supplies only a fundamental mode is not provided, the active waveguide comprising:
   a first wave guide that supplies a plurality of modes including a fundamental mode and a mode other than the fundamental mode; and
   a second waveguide that is wider than the first waveguide and supplies a multimode,
   wherein the fundamental mode is provided as oscillation light oscillated from the active waveguide.

9. The semiconductor optical amplifier according to claim 8, wherein the first waveguide supplies the fundamental mode and a first-order mode, and
   the second waveguide does not allow the first-order mode as a standing wave.

10. The semiconductor optical amplifier according to claim 8, wherein the second waveguide is a 1-input/N-output type 1×N (N is a positive integer) multimode interference waveguide.

11. The semiconductor optical amplifier according to claim 8, wherein a taper structure having a waveguide width that is increased toward the second waveguide is provided between the second waveguide and the first waveguide.

12. The semiconductor optical amplifier according to claim 9, wherein the second waveguide is a 1-input/N-output type 1×N (N is a positive integer) multimode interference waveguide.

13. The semiconductor optical amplifier according to claim 9, wherein a taper structure having a waveguide width that is increased toward the second waveguide is provided between the second waveguide and the first waveguide.

14. The semiconductor optical amplifier according to claim 10, wherein a taper structure having a waveguide width that is increased toward the second waveguide is provided between the second waveguide and the first waveguide.

15. An optical communication device incorporating the semiconductor laser diode according to claim 1.

16. An optical communication device incorporating the semiconductor optical amplifier according to claim 8.

* * * * *